(12) United States Patent
Hesselbarth et al.

(10) Patent No.: US 11,742,960 B2
(45) Date of Patent: Aug. 29, 2023

(54) TEST EQUIPMENT FOR TESTING A DEVICE UNDER TEST HAVING A CIRCUIT COUPLED TO AN ANTENNA

(71) Applicant: Advantest Corporation, Tokyo (JP)

(72) Inventors: Jan Hesselbarth, Stuttgart (DE); José Moreira, Stuttgart (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/680,714

(22) Filed: Feb. 25, 2022

(65) Prior Publication Data

US 2022/0182155 A1 Jun. 9, 2022

Related U.S. Application Data

(63) Continuation of application No. PCT/EP2019/073024, filed on Aug. 28, 2019.

(51) Int. Cl.
*H04B 17/00* (2015.01)

(52) U.S. Cl.
CPC .............. *H04B 17/0085* (2013.01)

(58) Field of Classification Search
CPC ............ H04B 17/0085; G01R 31/3025; G01R 1/045; G01R 29/0821; G01R 29/0878; G01R 31/01
USPC ................. 375/224–228; 455/67.14
See application file for complete search history.

(56) References Cited

U.S. PATENT DOCUMENTS

| | | | | |
|---|---|---|---|---|
| 8,436,777 | B2* | 5/2013 | Ito | G01R 29/10 |
| | | | | 343/703 |
| 2012/0293379 | A1* | 11/2012 | Nickel | G01R 31/2822 |
| | | | | 343/703 |
| 2014/0179239 | A1* | 6/2014 | Nickel | G01R 31/2822 |
| | | | | 455/67.14 |
| 2014/0370821 | A1* | 12/2014 | Guterman | H04W 24/00 |
| | | | | 455/67.14 |
| 2015/0168486 | A1 | 6/2015 | Isaac et al. | |
| 2018/0003754 | A1* | 1/2018 | Schrattenecker | H01Q 1/2283 |
| 2018/0149674 | A1 | 5/2018 | Bock et al. | |
| 2019/0113556 | A1 | 4/2019 | Kao | |
| 2019/0162774 | A1* | 5/2019 | Huang | G01R 31/2822 |
| 2019/0353698 | A1* | 11/2019 | DaSilva | H04B 17/17 |
| 2021/0341528 | A1* | 11/2021 | Sanchez Hernandez | |
| | | | | H01Q 13/0208 |

FOREIGN PATENT DOCUMENTS

| | | |
|---|---|---|
| EP | 3451001 B1 | 10/2022 |
| JP | 2011049711 A | 3/2011 |
| WO | 2019133097 A1 | 7/2019 |

OTHER PUBLICATIONS

"Semi-Shielded Coupling Interface for Over-The-Air Wireless Testing." ip.com Journal, ip.com Inc., West Henrietta, L NY, US. Jun. 6, 2018 (Jun. 6, 2018), XP013178971, ISSN: 1533-0001.

* cited by examiner

*Primary Examiner* — Don N Vo

(57) ABSTRACT

Devices for testing a DUT having a circuit coupled to an antenna are disclose. The device can include a DUT location, a probe, and a ground area configured to serve as an antenna ground area for the antenna of the DUT. The ground area includes a slot that the antenna feed impedance is not affected or not affected significantly. The probe is adapted to weakly couple to the antenna of the DUT via the opening to probe a signal when the antenna of the DUT is fed by the circuit of the DUT and/or in order to couple a signal to the antenna which is fed to the circuit of the DUT by the antenna.

20 Claims, 9 Drawing Sheets

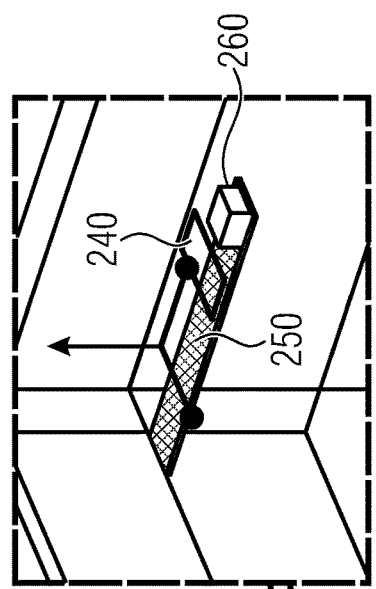
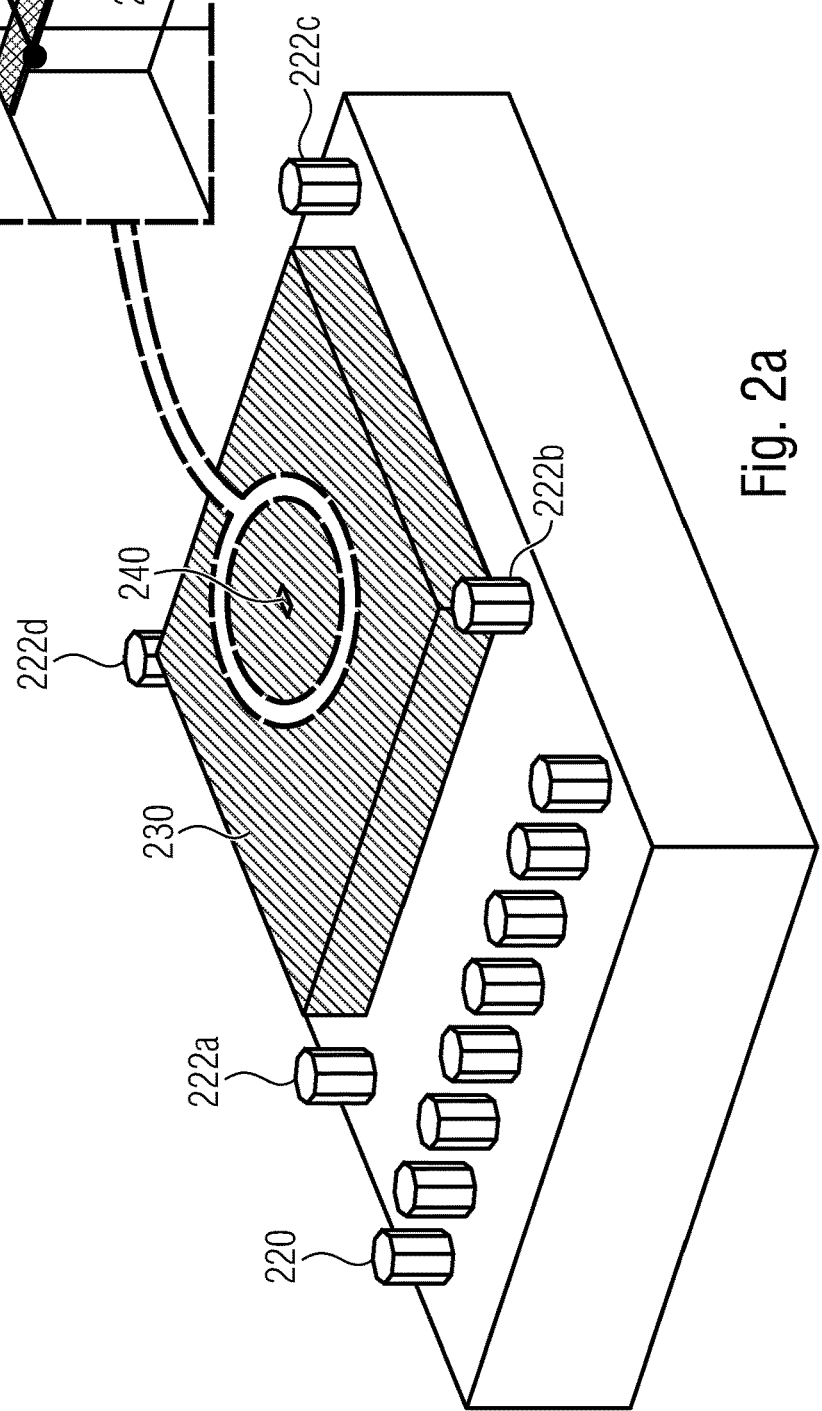

TEST EQUIPMENT FOR TESTING A DEVICE UNDER TEST HAVING A CIRCUIT COUPLED TO AN ANTENNA

CROSS-REFERENCE TO RELATED APPLICATIONS

This application is a continuation of copending International Patent Application No. PCT/EP2019/073024, with filing date Aug. 28, 2019, which is hereby incorporated by reference in its entirety.

FIELD

Embodiments of the present invention relate to a tester or test equipment (e.g., automated test equipment) for testing a device under test (DUT). More specifically, embodiments relate to test equipment for testing DUTs having an active circuit coupled to an antenna.

BACKGROUND

With a constant drive for integration, miniaturization and wireless connectivity, a new generation of devices for wireless applications, such as 5G and WiGig, are being developed that use a communication antenna within an integrated circuit die or package instead of a separate antenna as in previous generations. These integrated antennas are usually implemented as antenna arrays having multiple elements.

Wireless mobile or nomadic communication at millimeter-wave frequency promises per-user data rates of gigabits-per-second. Therefore, both WLAN-based and cellular/5G standards envision user access at frequencies as high as, 28 GHz, 39 GHz, 60 GHz or higher. To achieve relevant link distance, despite the high free-space attenuation at millimeter-wave frequency, high-directivity antennas may be employed at both ends of the link; at the base station side as well as at the side of the user device. In order to support mobility and flexibility, new generations of electronic devices may use electronic beam steering using phased array principles at the side of the user device. For example, millimeter-wave frequency spectrum offers frequency bandwidth resources for high-throughput or high-data-rate wireless transmission. As a result, 5G wireless communication such as advanced WiFi systems use millimeter waves. According to Friis' transmission equation $$P_{rec}(r) = P_t G_t G_{rec} \left(\frac{\lambda_0}{4\pi r}\right)^2,$$

where:
$P_{rec}$ and $P_t$ are receive power and transmit power,
$G_{rec}$ and $G_t$ are antenna gains,
r is the distance,
and $\lambda_0$ denotes the wavelength of the signal in air,
the high free-space loss or the high attenuation per distance at millimeter-wave frequency may be compensated by high-gain antennas on one or both ends of the wireless link. A high-gain antenna has a narrow beam width. For example, for mobile or nomadic applications, the beam direction of the antenna may be properly adjusted and directed towards the opposite end of the link. This includes adapting the polarization.

For the sake of compactness, package-integrated antenna array modules are favored, which include one or more multi-transceiver integrated circuits together with a multi-layer planar antenna array. The antenna array form factor plays an important role. Two-dimensional planar arrays with beams perpendicular to the array (e.g., dual-linear polarized) may be employed together with beams originating from a linear array with end fire (e.g., sideward) radiation.

For example, most applications rely on electronic beam steering and/or beam switching, which does not depend on mechanical means to change the direction of the beam; rather, this can be accomplished using antenna arrays. Although not strictly required, many antenna arrays place the radiating elements of the array close to each other in order to, avoid radiation or constructive interference of the respective contributions of the radiators of the array in unwanted directions. For a planar array, a typical distance (e.g., center-to-center distance), between the elements of the array is, for example, approximately 0.6 wavelength, which is a free-space wavelength $\lambda_0$.

A generic antenna array consists of a number of radiator elements on a flat plane, each radiator element allowing radiation in two orthogonal, isolated polarizations in the direction perpendicular to the plane and in a spatial sector centered around this perpendicular axis. The antenna array may be periodic in two directions in the plane, with a periodicity of $0.6 \times \lambda_0$.

The standard operation of such antenna array involves a predictable constructive interference in a given spatial direction of all radiation contributions from the elements of the array. This requires a well-defined operation of each radiator element in magnitude and phase, preferably for both polarizations, including transmit and/or receive electronics.

Rather complex integrated circuits may combine as many as 32 transceiver channels and/or built-in self-test functionality on the chip. The complete radiation module, incorporating one or several integrated transceiver chips and a multi-layer board with a signal distribution and an antenna array, represents a significant packaging complexity and, therefore the module needs to be tested in production. In addition, a user device may include several radiation modules at different, spatially separated positions of the device, and it may operate in multi-beam or MIMO mode. Testing the full set of capabilities of such user device in an over-the-air (OTA) test is extremely involved.

In the past the antenna was not included in the device under test (DUT). These devices are tested through an electrical connection using standard radio frequency (RF) measurement techniques. Wireless DUTs with integrated antenna arrays in the die or in the package may be tested in their mission mode by a reciprocal antenna or antenna array that measures the wireless signals from the DUT and/or may also provide stimulus signals to the DUT. In other words, the DUT with integrated antenna arrays may not only be tested in a transmission mode of the DUT, but also possible, or in some cases required, to be tested in a receive mode of the DUT. Automated test equipment (ATE) or systems for testing these types of devices require a method and a probe and/or an antenna to receive and stimulate the DUT wirelessly, also referred to as over-the-air (OTA) testing.

A standard approach for measuring a DUT with an integrated antenna array is to use a standard off-the-shelf antenna, like a horn antenna, in the far-field measurement region far away from the DUT on a properly shielded measurement enclosure.

The operation of the array may be tested by measuring the surrounding space with a probe, at some well-defined distance, in order to map radiation intensity, for measuring the transmission, while measuring receiving is similar, over all spatial directions, using spherical coordinates θ and φ. This concept is typically implemented in an antenna anechoic measurement chamber with spherical scanning capability.

In addition to the mechanical complexity of precision spherical scanning, the distance between the array and the probe antenna may be quite large, the measurement may be done in the far-field region of the array antenna. The minimum distance for far-field is given as, approximately with several constraints, $2 \times D^2/\lambda_0$, where D stands for the maximum dimension of the antenna array, often the diagonal length across the array aperture. This far-field distance may be several meters in the medium-to-high gain millimeter-wave arrays.

Adapting a conventional anechoic chamber approach for far-field measurements becomes a very expensive investment due to the large number of antenna probes, with test transceivers connected, to be mounted in the anechoic chamber. Such approach is also not practical for a production test due to the lengthy measurement time for each device.

This approach, although ideal for a lab type measurement setup, may not be integrated in a standard test cell for high-volume testing of integrated circuits due to the dimensions required. Also, by working in the far-field region with a single antenna, it measures the DUT antenna array as a single beam, where all the antenna elements are radiating and their signals combine into a single beam, instead of each element on the DUT antenna array separately. If the probe antenna approaches each of the individual antenna elements of the antenna array on the DUT, the measurement or probe antenna by itself will disturb the DUT antenna array element and invalidate the measurement.

Alternatively, the probe may scan around the antenna array in a shorter distance, in the so-called radiating near-field. These measured data, which include magnitude and/or phase, may be transformed mathematically, by using a Fourier transformation, to the far-field. To some extent, these data may also be transformed towards the antenna array, until the local field distribution across the radiating aperture is obtained or approximated and a single failed antenna array radiator element may be localized.

Reverting to conventional near-field measurements characterizing electrically large radiating structures by probing them in their radiating near-field, followed by mathematical transformations, is disadvantagesou as the measurement time for a DUT becomes large (e.g., when all spatial directions need to be scanned).

For a production test or for calibration of a complete radiation module, it may be sufficient to characterize the path from a given transceiver of the radiation module to the air interface of its connected radiator element. Provided that a test mode of the radiation module supports the sequential test of all transceivers, a single probe antenna placed in front of the array antenna, from a small distance or in the radiating near-field of the antenna array, but still in the far-field of a single radiating element of the array, may be employed to conduct such a test.

In other words, the operation of a single antenna array radiator, together with the associated transmit or receive chain, can be probed in a single spatial direction in magnitude and phase. It is assumed that the radiation properties in all other directions, including couplings with/to other array elements, will work as well, for example, based on the design, simulations or prior measurements of a known-good device. For example, when a probe antenna is placed in front of the array. The elements of the array are selected one after another. The distance between the antenna array and the probe antenna is such that the probe antenna is in the radiating near-field of the array antenna, but in the far-field of the single radiating array element. A non-reflecting and/or absorbing enclosure or absorber material allows for a compact setup.

Despite of the simplicity of the concept, there are several drawbacks. First, as a sequential concept, it may be more time-consuming than a more parallelized approach. Second, depending on the geometry of the setup, the probe antenna "sees" the respective radiating elements of a large antenna array in a compact setup under different angles, such that an absolute measurement is needlessly complicated, and thus only a comparison with a known-good-device is reasonable. Third, couplings from the "switched-on" radiator element to other radiator elements may superimpose in a complex way, such as through a free space but not in a far-field, through board surface waves, or through transceiver mismatch. Therefore, the measured response may not be quantified with confidence.

In view of this situation there is a need for a testing solution which provides an improved compromise between complexity, accuracy and cost for testing DUTs having a circuit coupled to an antenna.

SUMMARY

Devices for testing a DUT having a circuit coupled to an antenna are disclosed. The device can include a DUT location, a probe, and a ground area configured to serve as an antenna ground area for the antenna of the DUT. The ground area includes a slot that the antenna feed impedance is not affected or not affected significantly. The probe is adapted to weakly couple to the antenna of the DUT via the opening to probe a signal when the antenna of the DUT is fed by the circuit of the DUT and/or in order to couple a signal to the antenna which is fed to the circuit of the DUT by the antenna.

According to one disclosed embodiment, a device for testing a device under test (DUT), is disclosed. The device includes a circuit, a probe, a ground area operable to ground an antenna of a DUT, the ground area includes an opening, a DUT location on a first surface of the ground area operable to receive the DUT, the probe is disposed on a second surface of the ground area and operable to be coupled to the antenna of the DUT via the opening to probe a signal when the antenna of the DUT receives electronic signals from the circuit of the DUT.

According to some embodiments, the probe is conducting and provides a signal to the circuit of the DUT, the signal is generated by the antenna.

According to some embodiments, the probe forms a transmission line between the antenna and the circuit.

According to some embodiments, the probe is disposed substantially within a reactive near-field region of the antenna.

According to some embodiments, the ground area and the probe are disposed within the DUT location.

According to some embodiments, the probe is operable to probe a signal radiated by the antenna of the DUT, the probe is coupled to a field which leaks through the opening of the ground area.

According to some embodiments, the opening and the probe are disposed within the ground area to ground a patch antenna of the DUT.

According to some embodiments, the DUT location includes a contact region operable to electronically couple the DUT location to the DUT, the ground area is disposed next to the contact region, a portion of the DUT contacts the contact region when the DUT is in the DUT location, and an integrated antenna of the DUT is disposed near the ground area when the DUT is in the DUT location.

According to some embodiments, the device further including a first contact region and a second contact region, the ground area is disposed between the first contact region and the second contact region, an integrated antenna of the DUT is disposed between the first and second contact regions and next to the ground area when the DUT is in the DUT location.

According to some embodiments, the ground area is substantially coplanar with the first and second contact regions.

According to some embodiments, the opening includes a narrow slot, and the probe is disposed substantially parallel to the narrow slot.

According to some embodiments, a dimension of the slot is approximately 0.2 times a free space wavelength of a center frequency of the antenna of the DUT.

According to some embodiments, a portion of the ground area is excited by the antenna of the DUT, and a local current direction of the portion of the ground area is substantially perpendicular to the slot.

According to some embodiments, the antenna is coupled to the circuit.

According to some embodiments, the DUT includes a plurality of antennas and a plurality of circuits.

According to some embodiments, the device further includes a plurality of ground areas including probes and openings.

According to some embodiments, the device further includes an absorber material disposed in a radiating near-field region of the antenna of the DUT.

According to some embodiments, the device includes an absorber material disposed in a far-field region of the antenna of the DUT.

According to some embodiments, the DUT includes an embedded wafer level ball grid array (eWLB) package.

According to some embodiments, the device further includes a test line, the probe is operable to probe currents induced into the ground area through the opening using the test line, the probe is further configured to weakly probe the currents with a significant attenuation between the antenna and the probe to prevent interference with the antenna.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 2a is a diagram of an exemplary tester for testing a device under test according to embodiments of the present invention.

FIG. 2b is a diagram of an exemplary opening of the tester on FIG. 2a according to embodiments of the present invention.

DETAILED DESCRIPTION

In the following, different inventive embodiments and aspects will be described. Also, further embodiments will be defined by the enclosed claims.

It should be noted that any embodiments as defined by the claims may optionally be supplemented by any of the details, features and functionalities described herein. Also, the embodiments described herein may be used individually, and may also optionally be supplemented by any of the details, features and functionalities included in the claims.

Also, it should be noted that individual aspects described herein may be used individually or in combination. Thus, details may be added to each of said individual aspects without adding details to another one of said aspects. It should also be noted that the present disclosure describes, explicitly or implicitly, features usable in a tester or in an automatic test equipment (ATE). Thus, any of the features described herein may be used in the context of a tester or in the context of an automatic test equipment.

Moreover, features and functionalities disclosed herein, relating to a method, may also be used in an apparatus configured to perform such functionality. Furthermore, any features and functionalities disclosed herein with respect to an apparatus may also be used in a corresponding method. In other words, the methods disclosed herein may be supplemented by any of the features and functionalities described with respect to the apparatuses.

The present invention will be understood more fully from the detailed description given below, and from the accompanying drawings of embodiments of the present invention, which, however, should not be taken to limit the present invention to the specific embodiments described, but are for explanation and understanding only.

Figure 1:
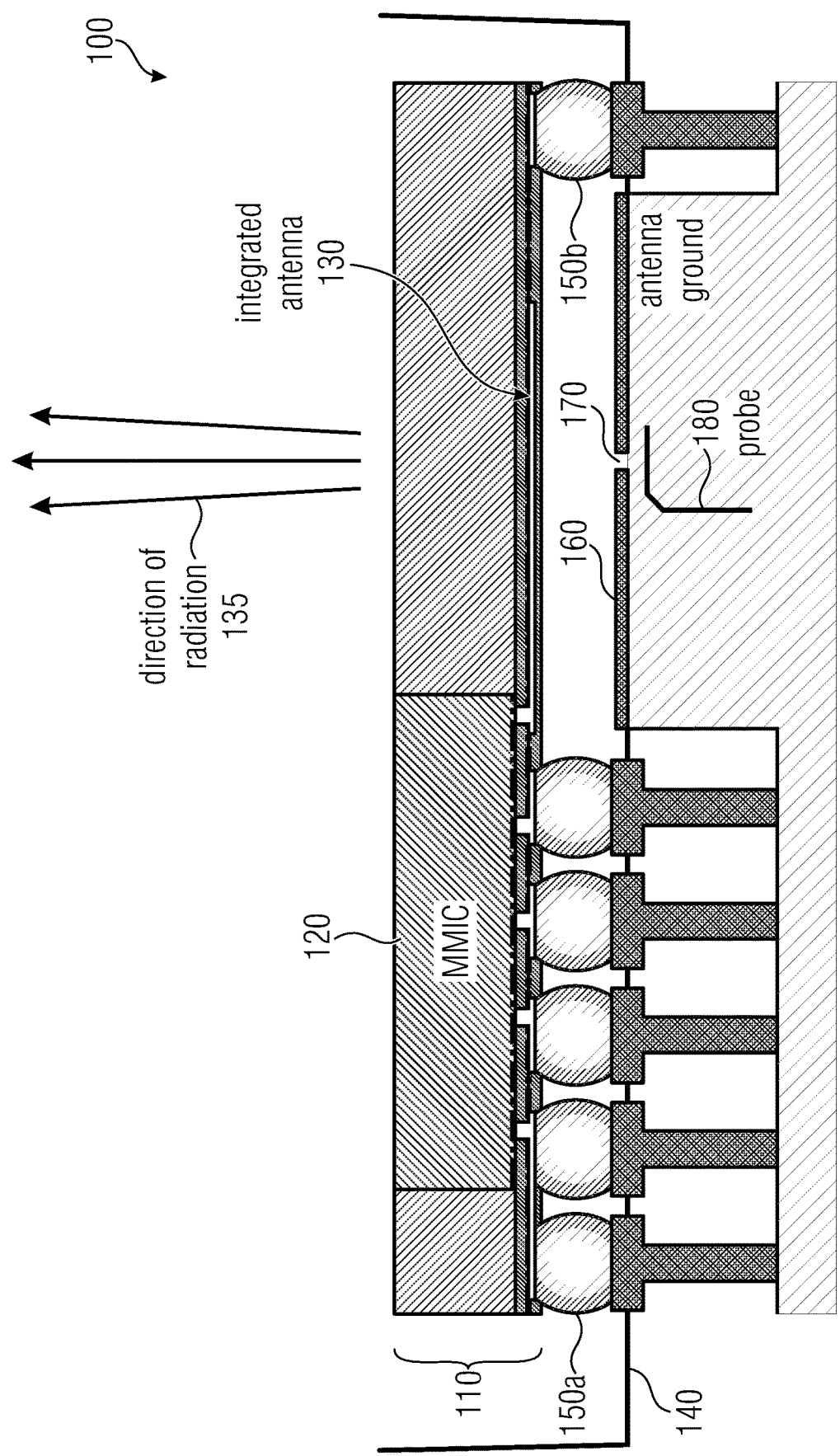
FIG. 1 is a diagram of an exemplary tester for testing a device under test having a circuit and an antenna which is coupled to the circuit according to embodiments of the present invention.

FIG. 1 depicts an exemplary tester 100 for testing a device under test (DUT) 110 according to embodiments of the present invention. The DUT 110 is inserted in the tester 100 and includes an active circuit 120, such as an MMIC, and an antenna 130, which is coupled to the circuit 120.

The DUT 110 is inserted into the DUT location 140 to be received by tester 100. The DUT location 140 includes two contact regions 150a and 150b, and a board ground 160, wherein the board ground 160 is located between the contact regions 150a and 150b. The tester 100 may be adapted to contact with the DUT 110 in the two contact regions 150a and 150*b*, using pogo pins and/or spring-loaded contacts as a contacts. The board ground 160 is substantially coplanar with the two contact regions 150*a* and 150*b*, (or with DUT-sided surfaces of the contacts) and disposed between the two contact regions 150*a* and 150*b*. The board ground 160 is positioned on top of a support or is otherwise raised above a surface on which the contacts are disposed in order to be coplanar with the contact regions 150*a* and 150*b*.

The antenna ground 160 includes a relatively small opening or slot 170, which is positioned in a central area of the board ground 160. The opening 170 in one embodiment may be a slot approximately equal to 0.2 times or 0.1 times a free space wavelength at the center of a frequency range of the antenna 130 of the DUT 110. The opening 170 can be even smaller, according to some embodiments. The local current direction in the board ground 160 at the location of the slot 170 (excited by the antenna 130 of the DUT 110) is perpendicular or parallel to the slot 170, with a tolerance of approximately +/−20 degrees relative to the main portion of slot 170.

The tester 100 further includes a probe 180 disposed underneath the board ground 160 and the slot 170. The probe is positioned on the side of the board ground 160 opposite of the side having the antenna 130. As depicted in FIG. 1, probe 180 is disposed within a base or riser that supports tester 100. The probe 180 may be conducting, and the main portion of the probe 180 may be orthogonal within +/−20 degrees to a main portion of the opening or slot 170. The distance between the antenna ground 160 and the probe 180 may be equal or less than $\lambda_0/20$ at the center frequency of the frequency range of the antenna 130 of the DUT 110 according to some embodiments.

The DUT location 140 of the tester 100 is configured to provide power to the DUT 110 and/or communicate with the active circuit 120 (e.g. MMIC), which is coupled to the antenna 130 of the DUT 110 via the contact regions 150*a* and 150*b*. The board ground 160 is configured to ground the antenna 130 of the DUT 110. The main radiation direction 135 of the antenna 130 points away from the antenna to a direction away from the probe 180 and/or away from the board ground 160. The probe 180 can probe a signal radiated by the antenna 130 of the DUT 110 using a field that leaks through the opening 170 in the board ground 160. In other words, the probe 180 can be coupled to the field that leaks through the opening 170 in the board ground 160 for probing.

In some cases, testing in-package antennas may use a board ground reflector 160 implemented using the board ground 160, and the weakly coupled probe 180 may advantageously be mounted below the board ground 160 coupled through opening 170.

The probe 180 can be disposed under the board ground and adapted to weakly couple to the antenna 130 of the DUT 110 via the opening 170 in order to probe a signal when the antenna 130 of the DUT 110 is fed by the circuit 120 of the DUT 110 and/or in order to couple a signal to the antenna 130 which is fed through the circuit 120 of the DUT 110 by the antenna 130. This approach may be useful especially for DUTs with planar antennas without ground, including antennas with dipole-like structures used for end-fire radiation towards the direction of the board. Here, a probe with conductive short can be used for weakly probing the central magnetic field of the dipole-like antenna. Because the probe 180 can be placed very close to the DUT, it may be easily integrated in automated test cells or in DUT locations that may be used to electronically test large volumes of integrated circuits. Testing a DUT at a very close range to the DUT (e.g., within near-field electromagnetic operating range) advantageously allows the measurement of each individual antenna element on the DUT antenna array and easy integration into the tester.

The advantages of tester 100 may also be applied to test in-package antennas 130 requiring external on-board reflectors 160. Such antennas may be used, for example, for embedded wafer level ball grid array (eWLB) packages with dipole and/or patch antennas, where the circuit board on which the package will be mounted provides a metal ground 160 to the antenna radiators 130. For example, the board ground 160 may be electrically coupled with one or more of the contacts for contacting the DUT such that there is a low-impedance connection between the ground area and the DUT when the DUT is inserted into the DUT location. To test such antenna-including package, the tester must provide the ground field at a defined location. The board ground/ground field effectively becomes part of the antenna 130. Currents induced into the ground metal may be probed through the small opening or slot 170 and coupled to a test line on the backside. Weakly probing with a significant attenuation between antenna and probe may be used in order to avoid disturbing the antenna operation during probing.

Therefore, tester 100 is useful for in-package antennas requiring external, on-board reflectors, such as eWLB package. The tester or tester connects the test object or DUT and provides the ground for the in-package antenna of the test object. The tester and/or tester probes the antenna field proportional (or at least in a fixed relationship) to the radiated field in magnitude and phase weakly through a small opening in the antenna ground provided. The probe coupling is so weak that the antenna feeding impedance is not significantly affected.

FIG. 2*a* shows an exemplary tester 200 without a DUT 210 according to embodiments of the present invention. The tester 200 includes contact 220, such as pogo pins and/or spring-loaded contacts, which may be grouped in one or more contact regions, such as contact regions 150*a* and 150*b* depicted in FIG. 1. The tester 200 further includes a ground area 230, which is elevated on a rectangular base or riser. Ground area 230 is substantially coplanar with the contacts 220 surrounding the ground area 230. In a central area of the ground area 230 is an opening or slot 240. Contacts 222*a-d* may be positioned near the corners of the base or riser. The width of the base may be larger than a free space wavelength of a signal at the center of the frequency range of the DUT. Contacts 222*a-d* connect the ground area 230, which is deposed on top of the protrusion, with the DUT. Several additional contacts 220 may be disposed along one of the edges of the base or riser to provide power and/or control signals to the DUT.

FIG. 2*b* depicts the slot 240 in the ground area 230. The main portion of the opening or slot 240 is approximately 0.2 times a free space wavelength at the center of a frequency range of the antenna of the DUT 210. Behind the slot 240 and/or behind the ground area 230, the tester 200 includes a probe 250, similar to the probe 180 depicted in FIG. 1. The main portion of the probe 250 is perpendicular to the main portion of the slot 240, within +/−20 degrees. The probe 250 may be conducting and may form a transmission line (or may be part of a transmission line) that can be short circuited by a conducting strip 260 in contact with the ground area 230. The probe is disposed substantially within a distance of less than $\lambda_0/4$ or less than $\lambda_0/20$ away from the slot 240. In other words, on one side of the slot 240, the probe 250 is short-circuited to the ground area, and on the other side of the slot, the transmission line is coupled to a circuit for providing a signal to the probe 250 or for evaluating a signal delivered by the probe 250.

FIG. 2a and FIG. 2b show the tester 200 coupled to the package, where a probe 250 or a micro strip line is passed through the coupling opening 240 (e.g., a rectangular slot). The micro strip line and/or the probe 250 are operable to couple to a field which leaks through the opening in the ground area in order to probe a signal radiated by the antenna of the DUT 210.

Figure 2D:
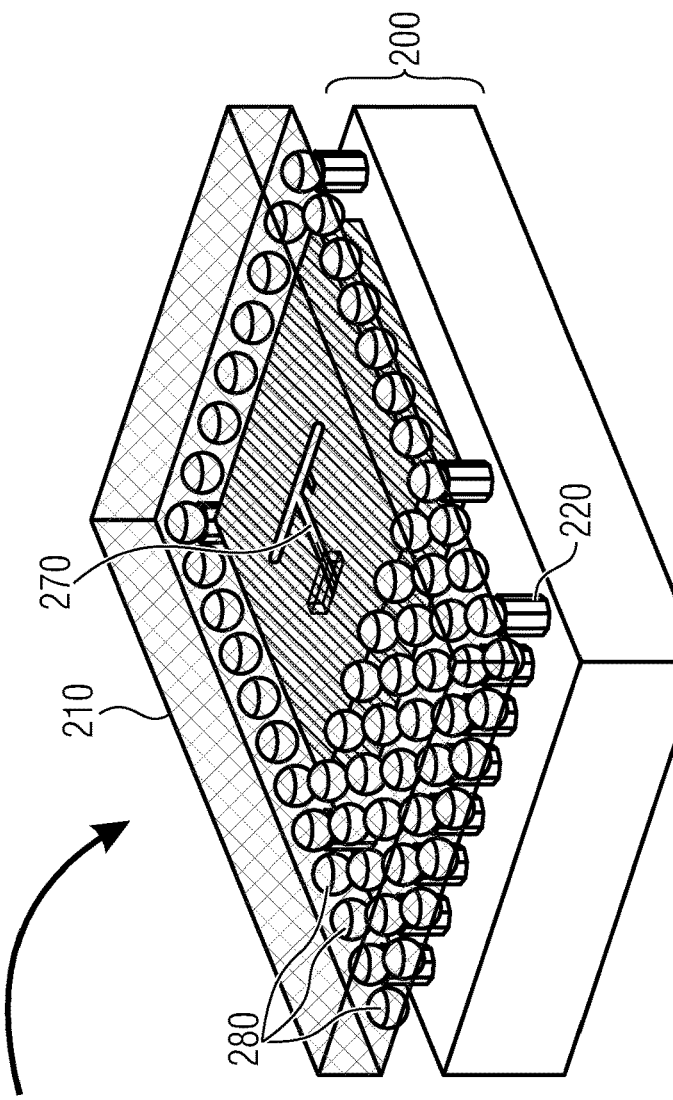
FIG. 2d is a diagram of an exemplary tester coupled to a device under test according to embodiments of the present invention.
Figure 2C:
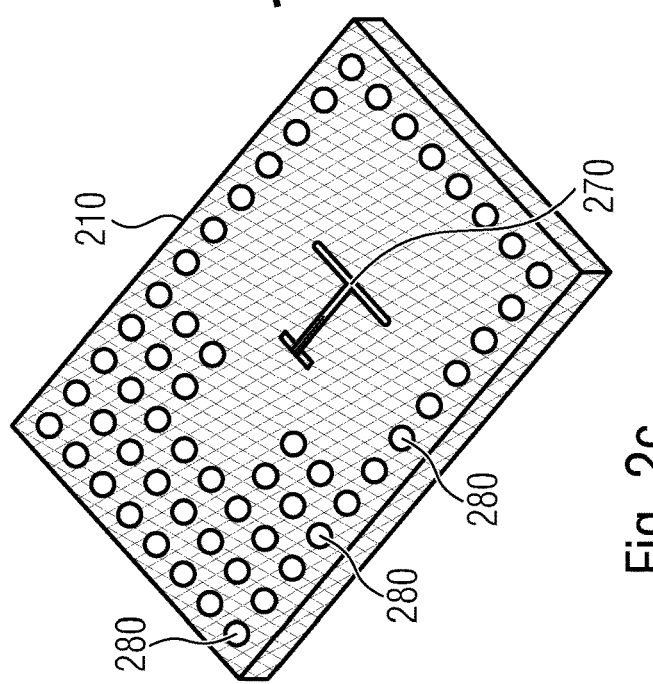
FIG. 2c is a diagram of an exemplary device under test comprising an antenna according to embodiments of the present invention.

FIG. 2c shows another view of DUT 210 according to embodiments of the present invention. The DUT 210 includes a dipole antenna 270 and an embedded wafer level ball grid array (eWLB) package 280. The DUT 210 includes a planar antenna for chip-embedded packages, such as in an eWLB package 280. The ground plane or ground area 230 is part of the circuit board that the module will be mounted onto and acts as a grounding plate for antenna 270 during testing.

FIG. 2d depicts exemplary tester 200 connected to a DUT 210 according to embodiments of the present invention. The tester 200 and the DUT 210 are coupled via contacts 220 and 222a-d of the tester 200 and over the eWLB-package 280 of the DUT 210. The DUT 210 is positioned on the tester 200 in such a way that the dipole antenna 270 of the DUT 210 is positioned in close proximity to ground area 230 and near the center of ground area 230 (e.g. over the opening 240 and over the probe 250).

Some testing for in-package antennas may require external on-board reflectors or a ground area 230. Such antennas are proposed for eWLB-packages with dipole or patch antennas 270, where the circuit board on which the package is mounted provides a metal ground 230 to the antenna radiators 270. To test such antenna-including package, the tester or the tester 200 may provide ground at the defined location. This ground field may become a part of the antenna 270. Currents induced into this ground metal 230 may be probed through a slot 240 in this ground 230 to a test line on the backside (or may be excited by a signal applied to the probe). The probing may mean weakly probing with significant attenuation between antenna 270 and probe 250 in order to avoid disturbing the antenna operation during probing.

The DUT 210 and/or a dummy chip with in-package dipole antenna 270 may require a ground area 230 or ground metal to operate properly. FIG. 2d depicts an exemplary in-package dipole antenna 270 with the ground area 230 of the tester 200.

Figure 3:
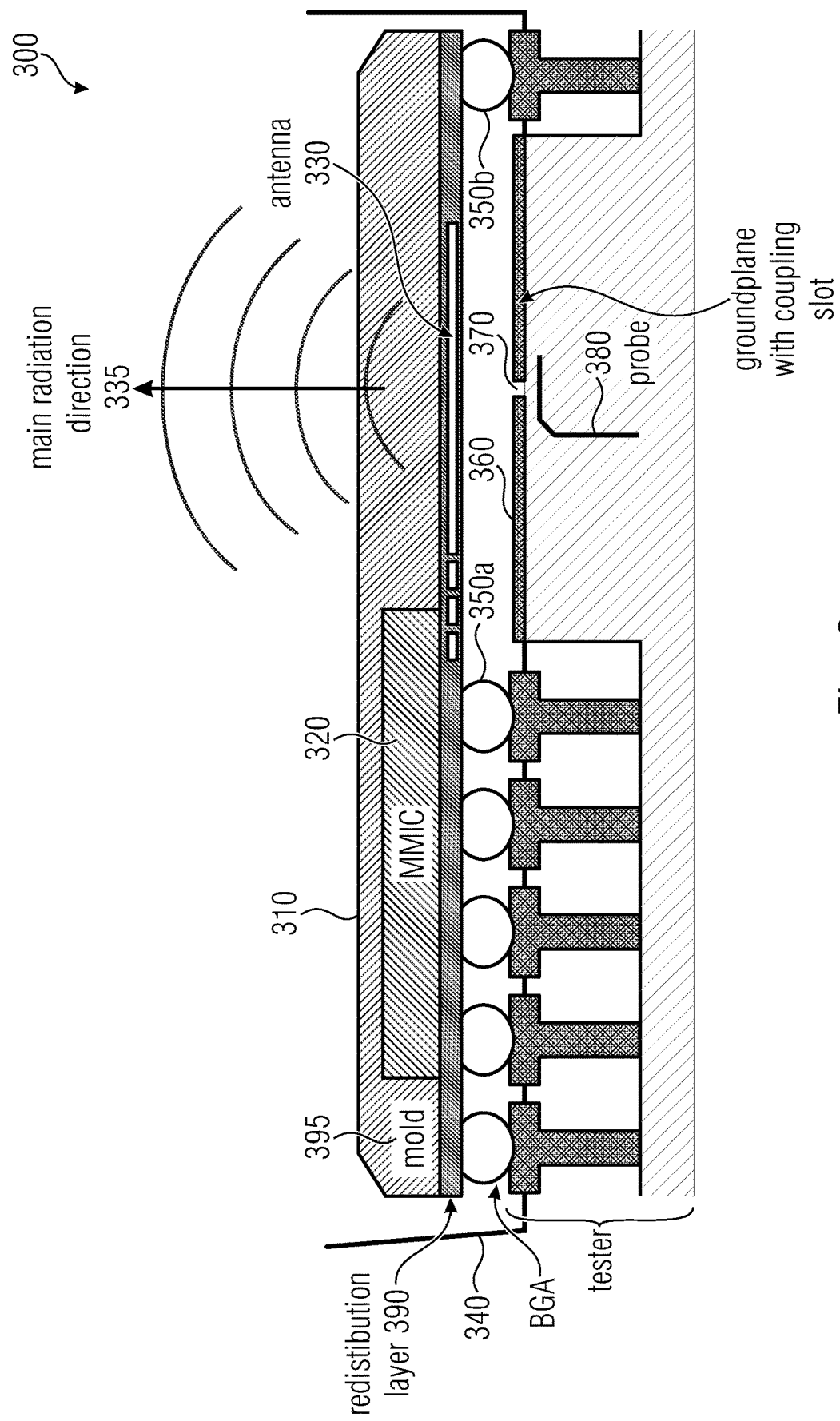
FIG. 3 is a diagram of an exemplary tester for testing a device under test having a circuit and an antenna which is coupled to the circuit according to embodiments of the present invention.

FIG. 3 depicts an exemplary tester 300 including a redistribution layer 390 coupled with contact regions 350a and 350b according to embodiments of the present invention. Similar to tester 100 depicted in FIG. 1, the tester 300 includes two contact regions 350a, 350b and a ground area 360 with a slot 370 in a central area of the ground area 360. The ground area 360 is in substantially coplanar with the contacts of the contact regions 350a and 350b. The contact regions 350a and 350b and the ground area 360 are integrated in the DUT location 340. DUT 310 is coupled to the tester 300 via the contacts of the contact regions 350a and 350b.

Probe 380 is positioned below the ground area 360 in close proximity to the opening 370. In other words, the DUT 310 is placed on a first side of the ground area 360, and the probe is placed on another, opposite side of the ground area 360.

DUT 310 includes a redistribution layer 390 and a mold 395. The redistribution layer 390 is coupled with the contact regions 350a and 350b of the tester 300 (e.g. via contact balls which may be part of a ball grid array, BGA), and includes an antenna 330 with a main radiation direction 335, pointing from the antenna 330 in a direction away from the probe 380. The redistribution layer 390 is also coupled to an active circuit 320 (e.g., an MMIC), which is positioned or encapsulated in the mold, opposite to the DUT location 340 (on a side of the redistribution layer 390 averted from the contacts and the ground area 360). The active circuit 320 is also coupled to the antenna 330.

Similar to the tester 100 on FIG. 1, the antenna 330 and/or the active circuit 320 is powered by the tester 300 via the contact regions 350a and 350b. The powered antenna 330 of the DUT 310 radiates mainly in direction 335, (e.g., away from the ground area 360 and/or away from the probe 380). The field of the antenna 330 leaks through the opening 370 in a ground area 360, and is probed by the probe 380, is positioned within a distance of no more than $\lambda_0/20$ from the antenna ground 360, according to embodiments.

Recoupling to the antenna reactive near-field when testing some antennas 330 in chip-embedded packages may require a metal layer or ground area 360 on the circuit board for proper operation. Without metal ground 360, the antenna 330 may be significantly de-tuned, leading to poor radiation and strong impedance mismatch at the transceiver input/output. In the example of FIG. 3, the tester or tester 300 provides the required metal ground 360 at the appropriate distance to the module. A small opening 370 in the ground plane 360 allows for well-defined coupling or recoupling to a transmission line 380 behind the metal ground 360, and thus for measuring the proper operation of the antenna 330. The probe and/or transmission lines 380 are behind a metal ground shield 360 (e.g. when seen from the DUT), and metal ground shield 380 can be part of the antenna (or can become part of the antenna when the DUT is placed in the DUT location) and is readily accessible. The metal ground shield 380 can include a slot that prevents the antenna feed impedance from substantial interference.

Figure 4A:
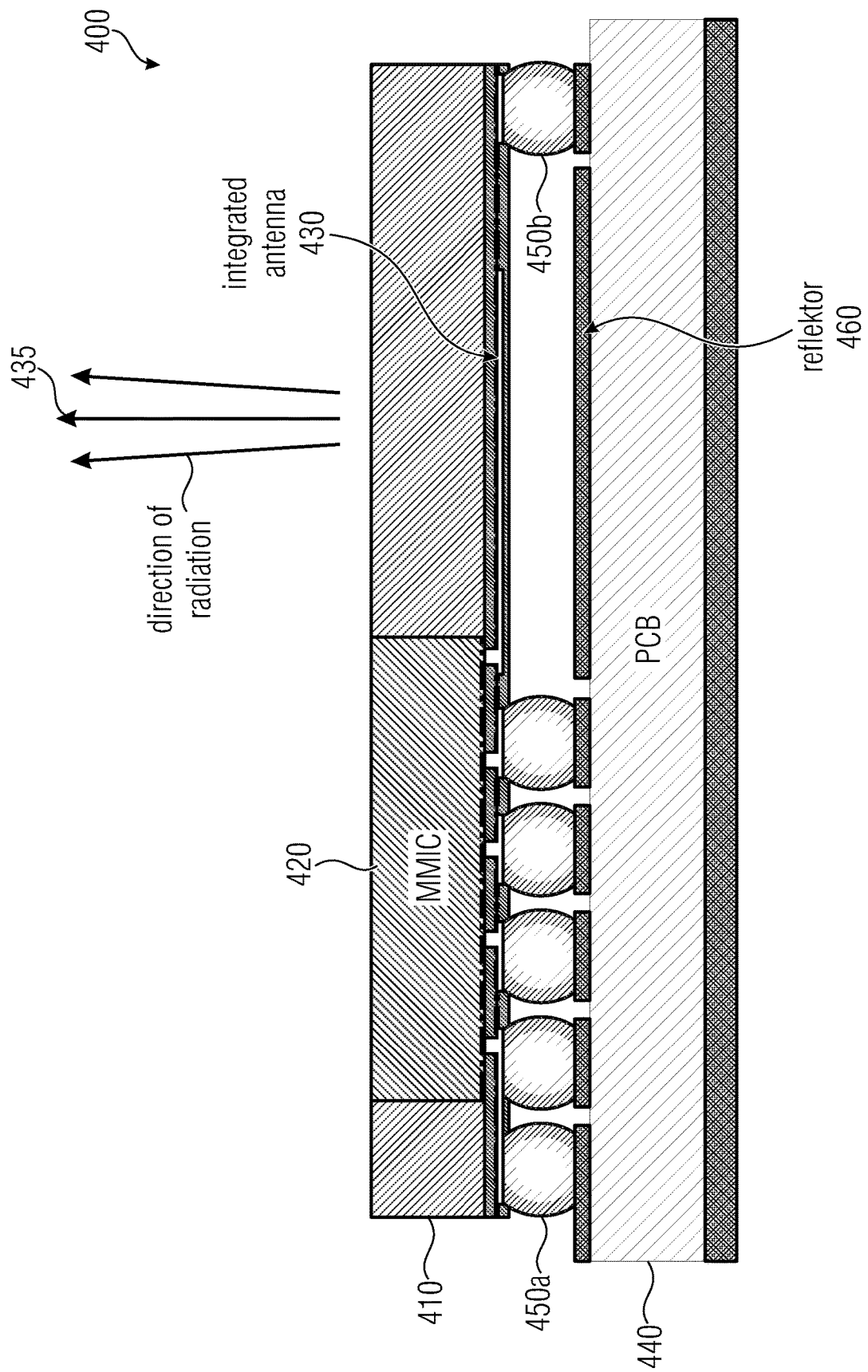
FIG. 4a is a diagram of an exemplary embedded wafer level ball grid array (eWLB) package concept according to embodiments of the present invention.

FIG. 4a shows a eWLB tester 400 according to embodiments of the present invention, wherein a DUT 410 is coupled to a printed circuit board 440, over the two contact regions 450a, 450b, and over the wire ball grid array 480 of the DUT. The printed circuit board 440 includes a ground area 460 which serves as a ground area between the two contact regions 450a and 450b, or as a reflector of the antenna 430 of the DUT 410. The DUT 410 includes an active circuit 420 and an integrated antenna 430. The integrated antenna 430 in some cases requires a ground metal 460 in order to operate properly, that means radiating a signal in a direction 435 pointing from the antenna 430 to a direction away from the ground area 460.

Figure 4B:
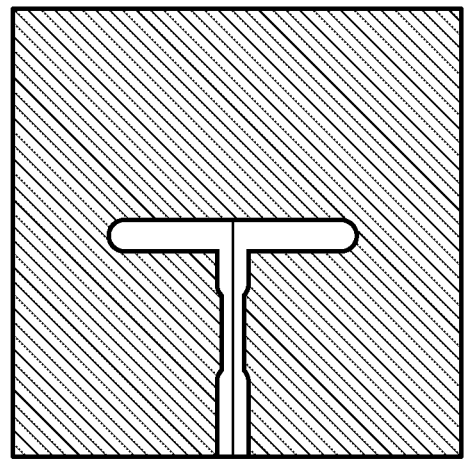
FIG. 4b is a diagram of different conventional antenna types according to embodiments of the present invention.
Figure 4B:
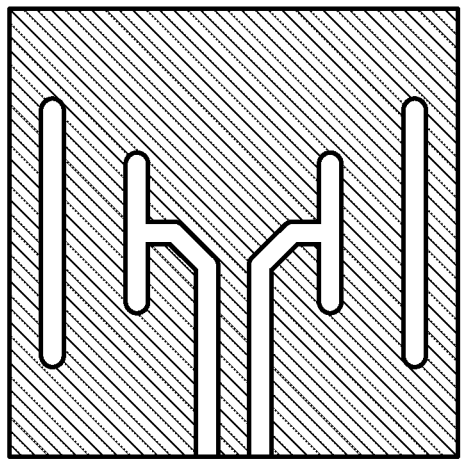
Figure 4B:
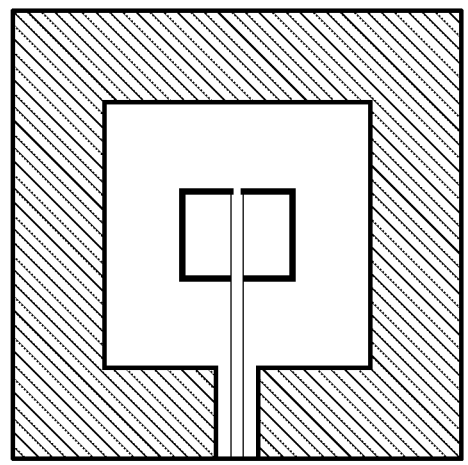
Figure 4B:
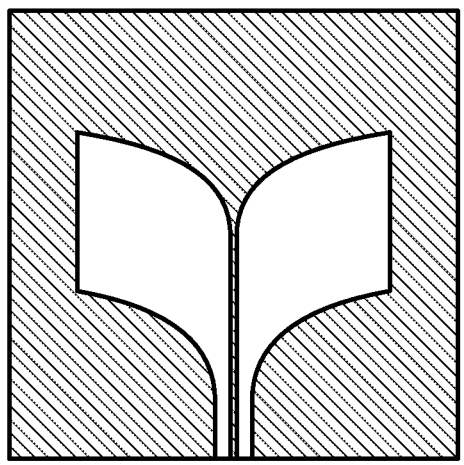

The integrated antenna 430 of a DUT 410 may have several antenna types. FIG. 4b shows some exemplary antenna types: a dipole antenna, an array of two dipole antennas, a CPW patch antenna, and a Vivaldi antenna.

Figure 4C:
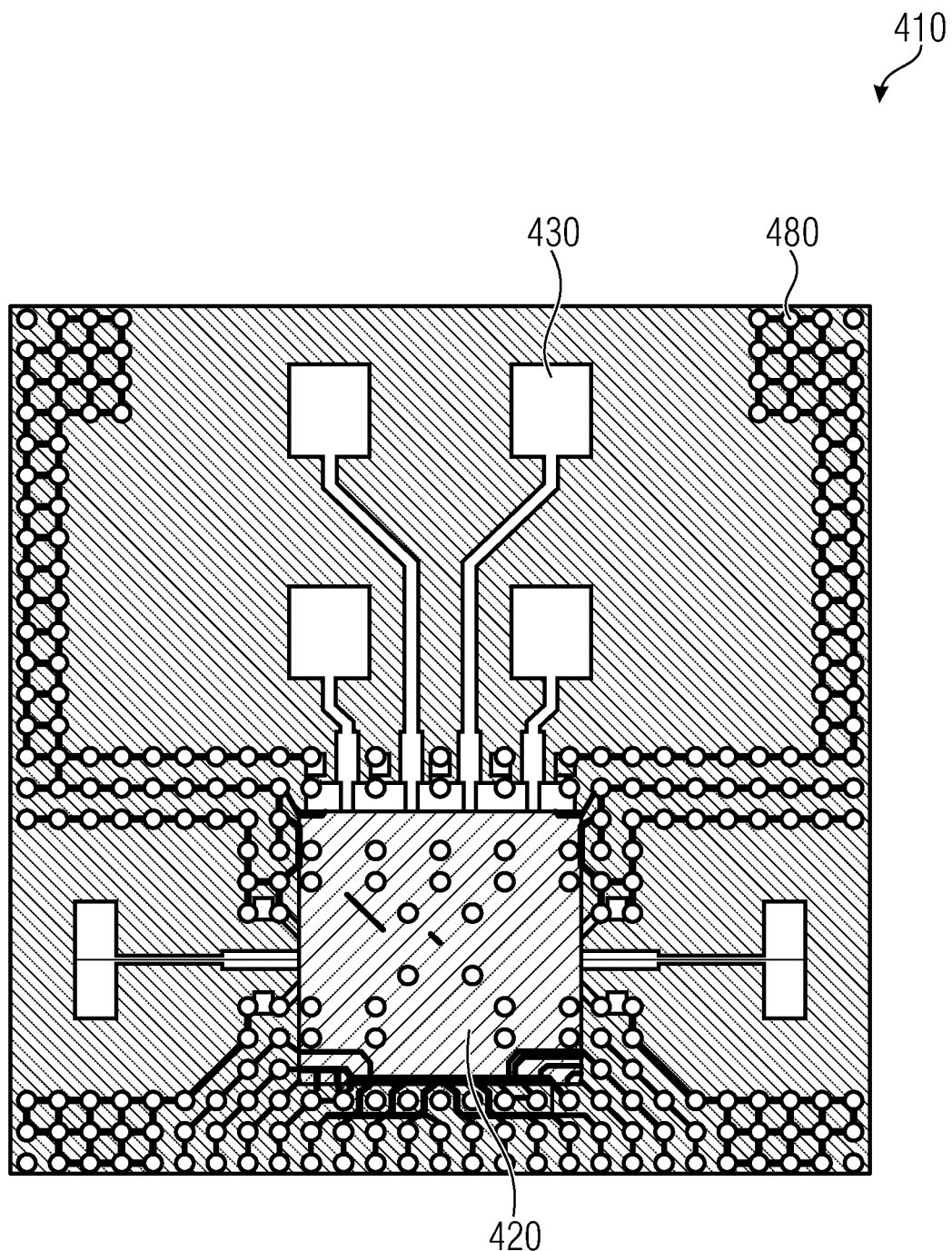
FIG. 4c is a diagram of an exemplary device under test to be tested with a tester according to embodiments of the present invention.

FIG. 4c shows an exemplary DUT 410 according to embodiments of the present invention, where the antenna 430 is coupled to the active circuit 420 and can be connected to additional components using ball grid array 480. DUT 410 may be tested and/or probed using tester 100 depicted in FIG. 1. The DUT 410 can be used in a package-embedded antenna as shown in FIG. 4a, for example. The antenna 430 may be one of the different antenna types described in FIG. 4b. The antenna 430 is coupled to the active circuit 420, which may be connected to and/or powered by further components over the ball grid array 480.

Figure 5:
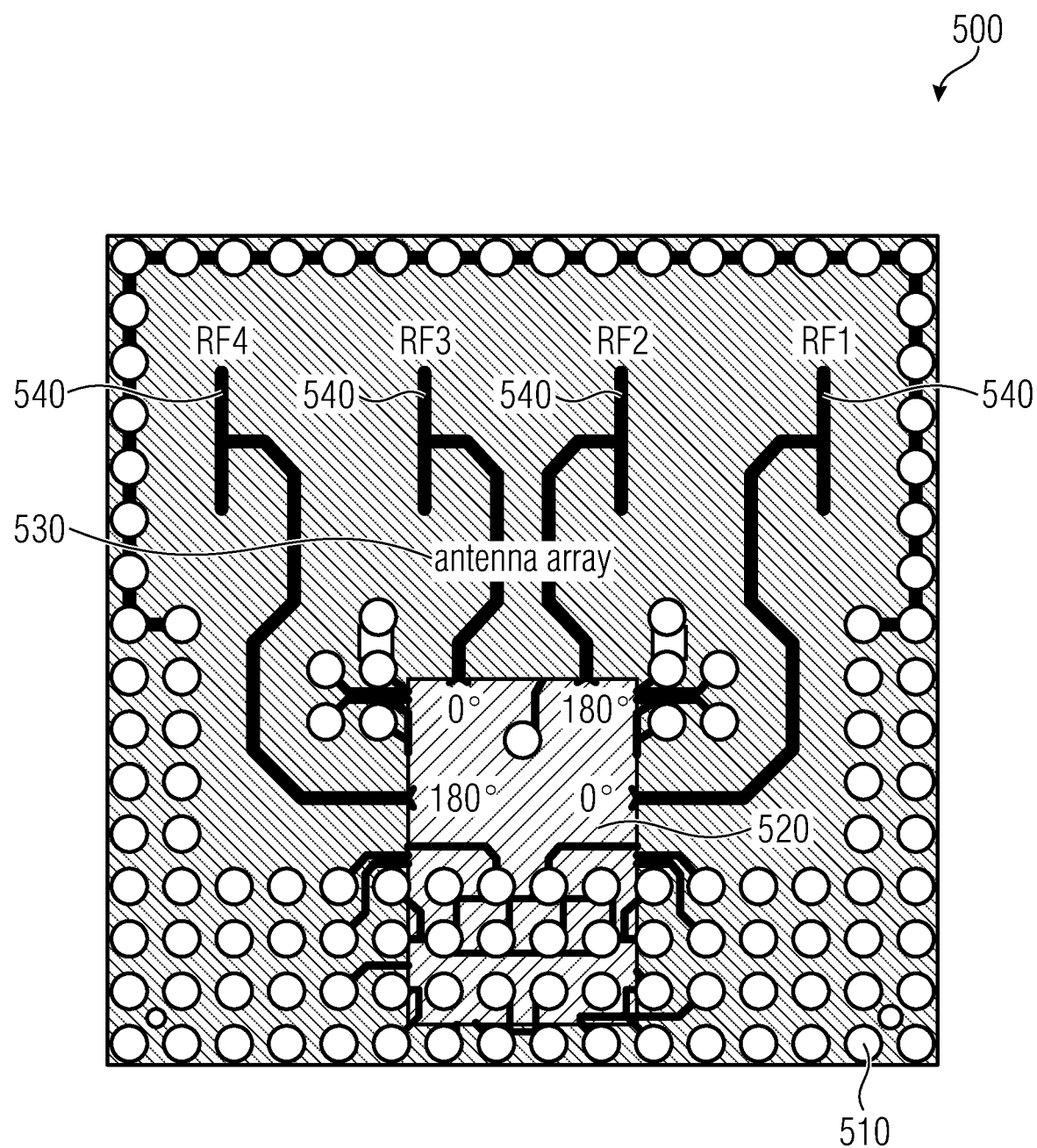
FIG. 5 is a diagram of an exemplary device under test to be tested with a tester according to embodiments of the present invention.

FIG. 5 shows a DUT 500 including a ball grid array package 510, an active circuit 520, and an array of antennas 530 according to embodiments of the present invention. The array of antennas 530 are coupled to the active circuit 520 which may contact to further circuit elements through the ball grid array 510. The antenna array 530 is powered by the active circuit 520 which connects to further circuit elements over the ball grid array 510.

DUT 500 can be tested in a tester similar to the tester 100, when placed in the DUT location of the tester. The antenna may require a metal layer or ground area on the circuit board and/or on the tester for proper operation. Without such metal ground the antenna elements 540 of the antenna array 530 may be significantly de-tuned, leading to poor radiation and strong impedance mismatch at the transceiver input/output. To test the DUT 500, the tester or tester can provide the required metal ground.

Figure 6:
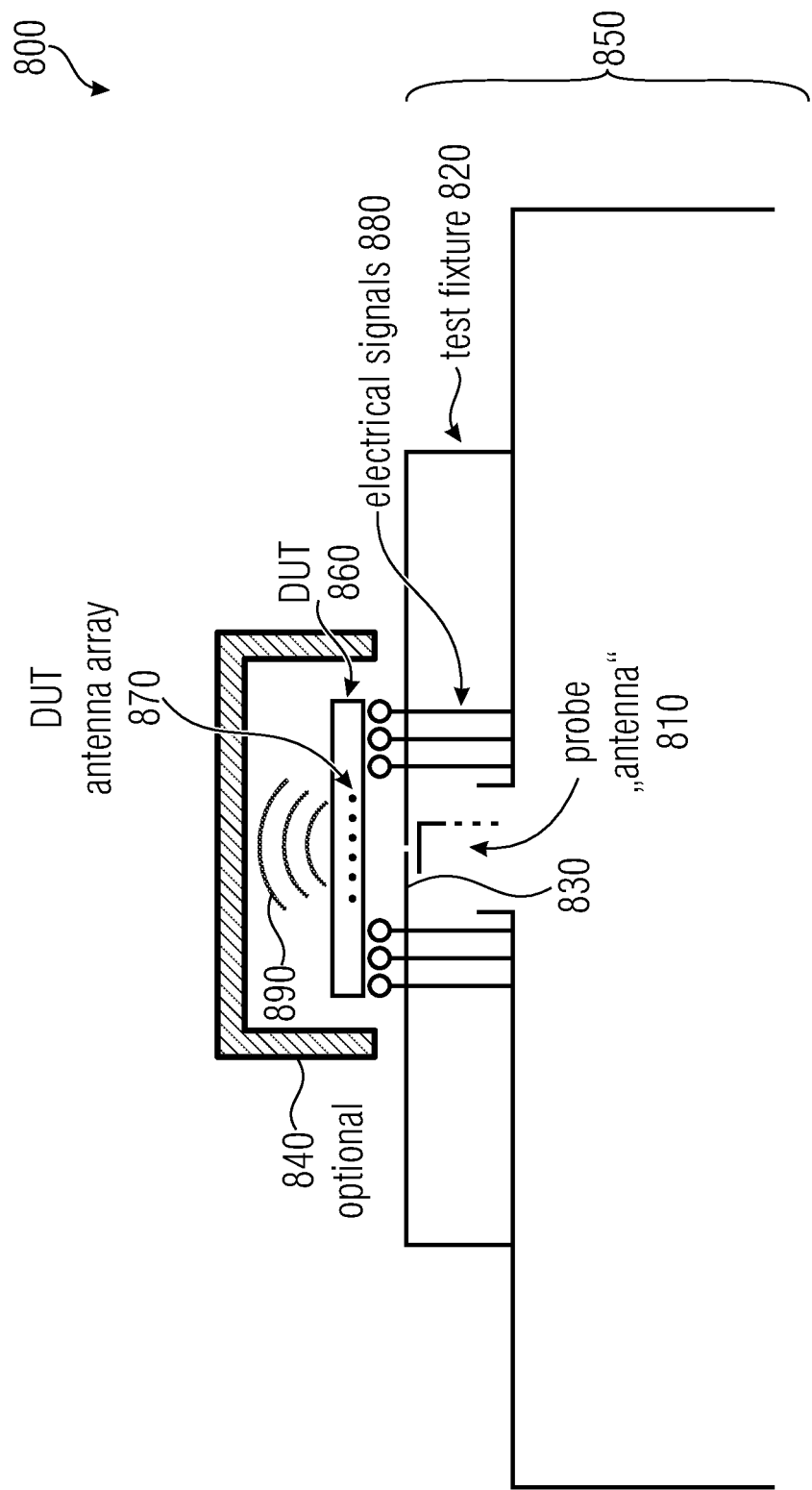
FIG. 6 is a diagram of an exemplary automated test equipment (ATE) having a tester as described in FIG. 1 according to embodiments of the present invention.

FIG. 6 depicts an exemplary automated test equipment (ATE) 800 including a tester 850 and a DUT 860 according to embodiments of the present invention. The tester 850 includes a measurement probe 810 and a test fixture 820 or DUT location. The test fixture 820 includes a ground plane or ground area 830. The ground plane serves as ground area for the antenna array 870 of the DUT 860. The ground plane 830 for the DUT antenna is provided by the tester or by the tester 850, or by the test fixture or by the ATE 800, and is substantially coplanar with the surface of the test fixture 820. In other words, if the module or the DUT is mounted on a circuit board, the metalized surface of the circuit board can form the ground plane.

The DUT 860 is positioned in the test fixture 820 and is electronically coupled to the tester 850. The DUT 860 includes a DUT antenna array 870, which is capable of sending wireless signals 890 via the electronic signals 880 of tester 850. An absorber 840 for the sent wireless signal 890 is positioned above the DUT 860, opposite to the ground area 830, in radiating near-field distance of the DUT antenna array 870. The absorber allows to keep the ATE structure compact, while avoiding unwanted coupling between antenna radiator elements of an antenna array 870, as well as avoiding unwanted deterioration of antenna feed impedance match conditions (e.g., detuning).

The antenna elements of the DUT antenna array 870 are probed by the probe antenna 810, which is positioned so that the test fixture 820 is between the DUT 860 and the probe antenna 810. ATE 800 sends electrical signals 880 to the DUT antenna array 870 of the DUT 860. The DUT antenna array 870 can transmit signals 890 that are received by the probe antenna 810 of the tester 850. The received signals are used to test the DUT 860.

Embodiments of the present invention are thus described. While the present invention has been described in particular embodiments, it should be appreciated that the present invention should not be construed as limited by such embodiments, but rather construed according to the following claims.

What is claimed is:

1. An apparatus for testing a device under test (DUT), comprising:
    a circuit;
    a probe;
    a ground area operable to ground an antenna of a DUT, wherein the ground area comprises an opening; and
    a DUT location on a first surface of the ground area operable to receive the DUT; and
    wherein the probe is disposed on a second surface of the ground area and operable to be coupled to the antenna of the DUT via the opening to probe a signal when the antenna of the DUT receives electronic signals from the circuit of the DUT.

2. The apparatus as described in claim 1, wherein the probe is operable to conduct and provide a signal to the circuit of the DUT, wherein the signal is generated by the antenna.

3. The apparatus as described in claim 1, wherein the probe forms a transmission line between the antenna and the circuit.

4. The apparatus as described in claim 1, wherein the probe is disposed substantially within a reactive near-field region of the antenna.

5. The apparatus as described in claim 1, wherein the ground area and the probe are disposed within the DUT location.

6. The apparatus as described in claim 1, wherein the probe is operable to probe a signal radiated by the antenna of the DUT, and wherein the probe is coupled to a field which leaks through the opening of the ground area.

7. The apparatus as described in claim 1, wherein the opening and the probe are disposed within the ground area to ground a patch antenna of the DUT.

8. The apparatus as described in claim 1, wherein the DUT location comprises a contact region operable to electronically couple the DUT location to the DUT, wherein the ground area is disposed next to the contact region, wherein a portion of the DUT contacts the contact region when the DUT is in the DUT location, and wherein an integrated antenna of the DUT is disposed near the ground area when the DUT is in the DUT location.

9. The apparatus as described in claim 1, further comprising a first contact region and a second contact region, wherein the ground area is disposed between the first contact region and the second contact region, wherein an integrated antenna of the DUT, is disposed between the first and second contact regions and further disposed next to the ground area when the DUT is in the DUT location.

10. The apparatus as described in claim 9, wherein the ground area is substantially coplanar with the first and second contact regions.

11. The apparatus as described in claim 1, wherein the opening comprises a narrow slot, and wherein the probe is disposed substantially parallel to the narrow slot.

12. The apparatus as described in claim 11, wherein a dimension of the narrow slot is approximately 0.2 times a free space wavelength of a center frequency of the antenna of the DUT.

13. The apparatus as described in claim 11, wherein a portion of the ground area is excited by the antenna of the DUT, and wherein a local current direction of the portion of the ground area is substantially perpendicular to the narrow slot.

14. An apparatus for testing a device under test (DUT), the apparatus comprising:
    a circuit;
    a probe;
    a ground area operable to ground an antenna of a DUT, wherein the ground area comprises an opening; and a
    DUT location on a first surface of the ground area operable to receive the DUT; and wherein the probe is operable to be disposed on a second surface of the ground area and further operable to be coupled to the antenna of the DUT via the opening to probe a signal when the antenna of the DUT receives electronic signals from the circuit of the DUT and wherein further the antenna is coupled to the circuit.

15. The apparatus as described in claim 14, wherein the DUT comprises a plurality, of antennas and a plurality of circuits.

16. The apparatus as described in claim 15, further comprising a plurality of ground areas comprising probes and openings.

17. The apparatus as described in claim 14, further comprising an absorber material disposed in a radiating near-field region of the antenna of the DUT.

18. The apparatus as described in claim 14, further comprising an absorber material disposed in a far-field region of the antenna of the DUT.

19. The apparatus as described in claim 14, wherein the DUT comprises an embedded wafer level ball grid array (eWLB) package.

20. An apparatus for testing a device under test (DUT), comprising:
- a circuit;
- a probe;
- a transmission line;
- a metal ground area operable to ground an antenna of a DUT, wherein the DUT comprises a redistribution layer and a mold, and wherein the mold comprises an active circuit coupled to the antenna of the DUT; and
- a DUT location on a first surface of the metal ground area operable to receive the DUT,
- wherein the ground area comprises an opening for coupling the transmission line to the antenna and the active circuit, wherein the transmission line passes through the opening, and wherein the metal ground substantially prevents interference from reaching the antenna during testing.

\* \* \* \* \*